United States Patent
Nakazawa et al.

(10) Patent No.: US 10,069,477 B2
(45) Date of Patent: Sep. 4, 2018

(54) SURFACE ACOUSTIC WAVE DEVICE AND FILTER

(71) Applicant: TAIYO YUDEN CO., LTD., Tokyo (JP)

(72) Inventors: Hidetaro Nakazawa, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/165,175

(22) Filed: May 26, 2016

(65) Prior Publication Data
US 2016/0373084 A1 Dec. 22, 2016

(30) Foreign Application Priority Data
Jun. 19, 2015 (JP) ................................ 2015-123933

(51) Int. Cl.
*H03H 9/64* (2006.01)
*H03H 9/02* (2006.01)

(52) U.S. Cl.
CPC ...... *H03H 9/6489* (2013.01); *H03H 9/02622* (2013.01); *H03H 9/02881* (2013.01); *H03H 9/02889* (2013.01)

(58) Field of Classification Search
CPC .... H03H 9/6489; H03H 3/08; H03H 9/02881; H03H 9/02622; H03H 9/02889
USPC ......................................... 333/133, 193–196
See application file for complete search history.

(56) References Cited

U.S. PATENT DOCUMENTS

2014/0001919 A1* 1/2014 Komatsu ............ H03H 9/02818
310/313 B
2015/0123746 A1 5/2015 Nakamura et al.

FOREIGN PATENT DOCUMENTS

| JP | 2009-278429 A | 11/2009 |
| JP | 2015-089069 A | 5/2015 |
| WO | 2012/127793 A1 | 9/2012 |

OTHER PUBLICATIONS

Japanese Office Action dated Feb. 20, 2018, in a counterpart Japanese patent application No. 2015-123933. (A machine translation (not reviewed for accuracy) attached.).

* cited by examiner

*Primary Examiner* — Robert J Pascal
*Assistant Examiner* — Jorge Salazar, Jr.
(74) *Attorney, Agent, or Firm* — Chen Yoshimura LLP

(57) ABSTRACT

A surface acoustic wave device includes: comb-shaped electrodes each including electrode fingers and dummy electrode fingers; and additional films located to cover gaps between tips of the electrode fingers of one of the comb-shaped electrodes and tips of the dummy electrode fingers of the other, wherein each of the additional films overlap with at least one of the electrode fingers and the dummy electrode fingers located lateral to the corresponding gap in a first direction in which the electrode fingers extend or in a second direction intersecting with the first direction, and a distance G of the gap is $0 < G \leq 1.0\lambda$ and a film thickness h of the additional films is $0 < h/\lambda \leq (0.146G + 0.694076) \times \rho 2/\rho 1$ where $\lambda$ is a wavelength of an acoustic wave, $\rho 1$ is a density of a material of the additional films, and $\rho 2$ is a density of aluminum oxide.

13 Claims, 15 Drawing Sheets

SURFACE ACOUSTIC WAVE DEVICE AND FILTER

CROSS-REFERENCE TO RELATED APPLICATION

This application is based upon and claims the benefit of priority of the prior Japanese Patent Application No. 2015-123933, filed on Jun. 19, 2015, the entire contents of which are incorporated herein by reference.

FIELD

A certain aspect of the present invention relates to a surface acoustic wave device and a filter.

BACKGROUND

There has been known, as an acoustic wave device using an acoustic wave, a surface acoustic wave device including an IDT (Interdigital Transducer) composed of a pair of comb-shaped electrodes located on a piezoelectric substrate. The surface acoustic wave device is used for filters in various types of circuits, as typified by, for example, mobile phones, that process radio signals in a frequency band of 45 MHz to 2 GHz.

In recent years, as communication devices such as mobile phones are sophisticated (for example, multi-band support, multi-mode support), it has been studied to decrease the loss of the filter to increase the receiving sensitivity of the communication device and to reduce the electrical power consumption. For example, it has been suggested to embed an insulating material between the tip of an electrode finger and a bus bar or the tip of a dummy electrode finger as disclosed in, for example, Japanese Patent Application Publication No. 2009-278429.

However, the conventional surface acoustic wave device has room for improvement in reducing the loss.

SUMMARY OF THE INVENTION

According to a first aspect of the present invention, there is provided a surface acoustic wave device including: a pair of comb-shaped electrodes located on a piezoelectric substrate, each of the pair of comb-shaped electrodes including a plurality of electrode fingers and a plurality of dummy electrode fingers, the plurality of electrode fingers of a first comb-shaped electrode of the pair of comb-shaped electrodes and the plurality of dummy electrode fingers of a second comb-shaped electrode of the pair of comb-shaped electrodes being arranged to face each other; and a plurality of additional films, each being located so as to cover a corresponding gap of a plurality of gaps between tips of the plurality of electrode fingers of the first comb-shaped electrode and tips of the plurality of dummy electrode fingers of the second comb-shaped electrode, wherein each of the plurality of additional films overlaps with at least a part of at least one of the electrode fingers and the dummy electrode fingers that are located lateral to the corresponding gap in a first direction in which the plurality of electrode fingers extend or in a second direction intersecting with the first direction among the plurality of electrode fingers and the plurality of dummy electrode fingers, and a distance G between the tips of the plurality of electrode fingers of the first comb-shaped electrode and the tips of the plurality of dummy electrode fingers of the second comb-shaped electrode is $0<G\leq1.0\lambda$ and a film thickness h of the plurality of additional films is $0<h/\lambda\leq(0.146G+0.694076)\times\rho2/\rho1$ where $\lambda$ is a wavelength of an acoustic wave excited in the pair of comb-shaped electrodes, $\rho1$ is a density of a material of the plurality of additional films, and $\rho2$ is a density of aluminum oxide.

According to a second aspect of the present invention, there is provided a surface acoustic wave device including: a pair of comb-shaped electrodes located on a piezoelectric substrate, each of the pair of comb-shaped electrodes including a plurality of electrode fingers and a bus bar to which the plurality of electrode fingers are connected, the plurality of electrode fingers of a first comb-shaped electrode of the pair of comb-shaped electrodes and the bus bar of a second comb-shaped electrode of the pair of comb-shaped electrodes being arranged to face each other; and a plurality of additional films, each being located to cover a corresponding gap of a plurality of gaps between tips of the plurality of electrode fingers of the first comb-shaped electrode and the bus bar of the second comb-shaped electrode, wherein each of the plurality of additional films overlaps with at least a part of at least one of the electrode fingers and the bus bar that are located lateral to the corresponding gap in a first direction in which the plurality of electrode fingers extend or in a second direction intersecting with the first direction among the plurality of electrode fingers and the bus bars, and a distance G between the tips of the plurality of electrode fingers of the first comb-shaped electrode and the bus bar of the second comb-shaped electrode is $0<G\leq1.0\lambda$ and a film thickness h of the plurality of additional films is $0<h/\lambda\leq(0.146G+0.694076)\times\rho2/\rho1$ where $\lambda$ is a wavelength of an acoustic wave excited in the pair of comb-shaped electrodes, $\rho1$ is a density of a material of the plurality of additional films, and $\rho2$ is a density of aluminum oxide.

According to a third aspect of the present invention, there is provided a filter including the above surface acoustic wave device.

DETAILED DESCRIPTION

Hereinafter, embodiments of the present invention will be described with reference to accompanying drawings.

First Embodiment

Figure 1A:
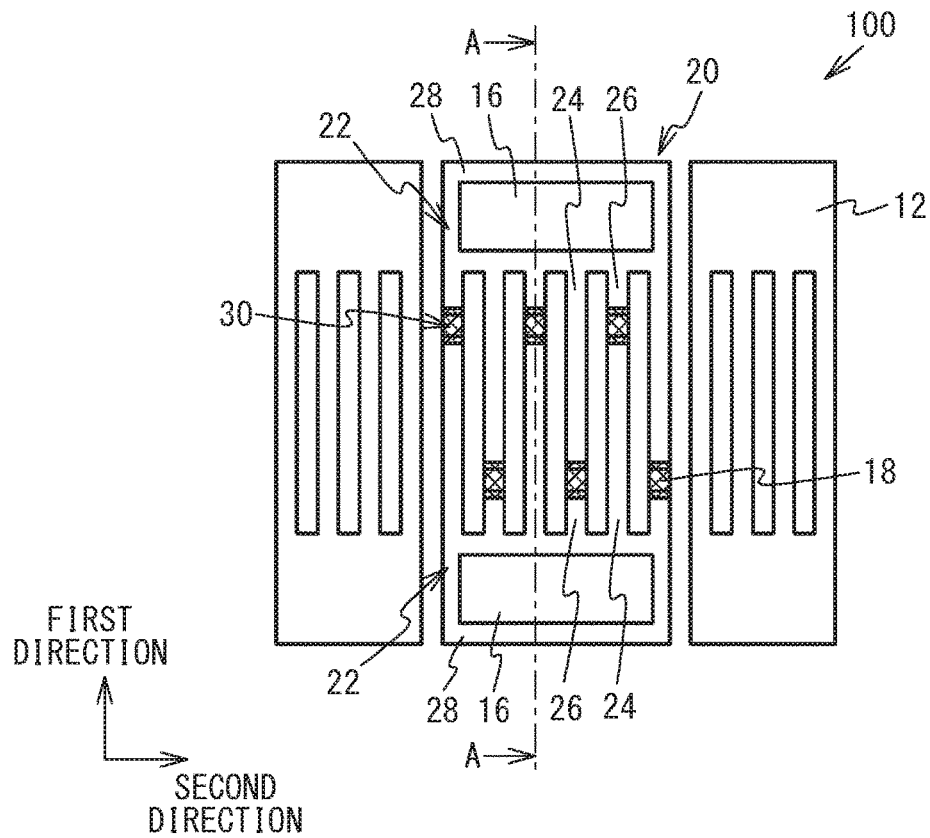
FIG. 1A is a top view of a surface acoustic wave device in accordance with a first embodiment.
Figure 1B:
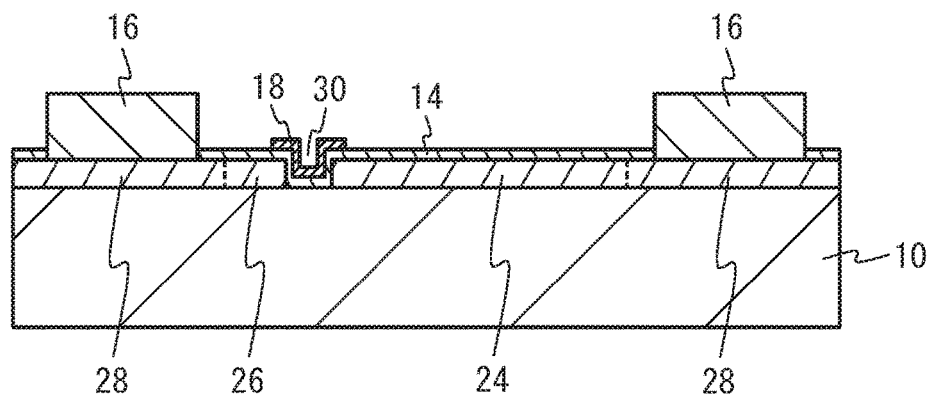
FIG. 1B is a cross-sectional view taken along line A-A in FIG. 1A.

FIG. 1A is a top view of a surface acoustic wave device 100 in accordance with a first embodiment, and FIG. 1B is a cross-sectional view taken along line A-A in FIG. 1A. In FIG. 1A, the illustration of a protective film 14 is omitted. As illustrated in FIG. 1A and FIG. 1B, the surface acoustic wave device 100 of the first embodiment includes an IDT 20 and reflectors 12 formed on a piezoelectric substrate 10. The IDT 20 excites an acoustic wave in the piezoelectric substrate 10 or on the surface of the piezoelectric substrate 10. The reflectors 12 reflect the acoustic wave. The piezoelectric substrate 10 is, for example, a lithium tantalite (LiTaO$_3$) substrate. The IDT 20 and the reflectors 12 are formed of, for example, an aluminum film.

The IDT 20 includes a pair of comb-shaped electrodes 22. Each of the pair of comb-shaped electrodes 22 includes a plurality of electrode fingers 24, a plurality of dummy electrode fingers 26, and a bus bar 28 to which the electrode fingers 24 and the dummy electrode fingers 26 are connected. In each of the pair of comb-shaped electrodes 22, the electrode fingers 24 and the dummy electrode fingers 26 are alternatively arranged. The electrode fingers 24 of a first comb-shaped electrode of the pair of comb-shaped electrodes 22 and the electrode fingers 24 of a second comb-shaped electrode of the pair of comb-shaped electrodes 22 are arranged in an alternate order.

The protective film 14 is formed to cover the IDT 20 and the reflectors 12 except a part of the bus bar 28. The protective film 14 is, for example, a dielectric film such as a silicon oxide film. The protective film 14 has a thickness of, for example, tenth part of the thickness of the IDT 20. A metal film 16 is formed on a part, which is not covered with the protective film 14, of the bus bar 28.

The pair of comb-shaped electrodes 22 are arranged so that the electrode fingers 24 of the first comb-shaped electrode and the dummy electrode fingers 26 of the second comb-shaped electrode face each other. This configuration forms a plurality of gaps 30 between the tips of the electrode fingers 24 of the first comb-shaped electrode and the tips of the dummy electrode fingers 26 of the second comb-shaped electrode. The protective film 14 covering the IDT 20 is embedded also in the gaps 30.

Each of a plurality of additional films 18 is located on the protective film 14 and in the corresponding gap 30 of the gaps. Each of the additional films 18 covers the corresponding gap 30 of the gaps. The additional films 18 have, for example, a rectangular shape. Here, the direction in which the electrode fingers 24 extend is defined as a first direction, and the direction that intersects with the first direction (i.e., the direction in which the electrode fingers 24 are arranged side-by-side) is defined as a second direction. Each of the additional films 18 overlaps with the electrode finger 24 and the dummy electrode finger 26 located lateral to the corresponding gap 30 in the first direction, and does not overlap with the electrode finger 24 located lateral to the corresponding gap 30 in the second direction. The additional film 18 is, for example, an aluminum oxide film.

Figure 2A:
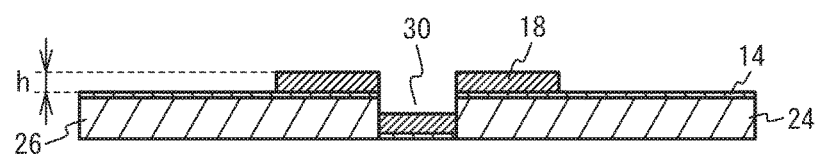
FIG. 2A is an enlarged cross-sectional of an area around a gap.
Figure 2B:
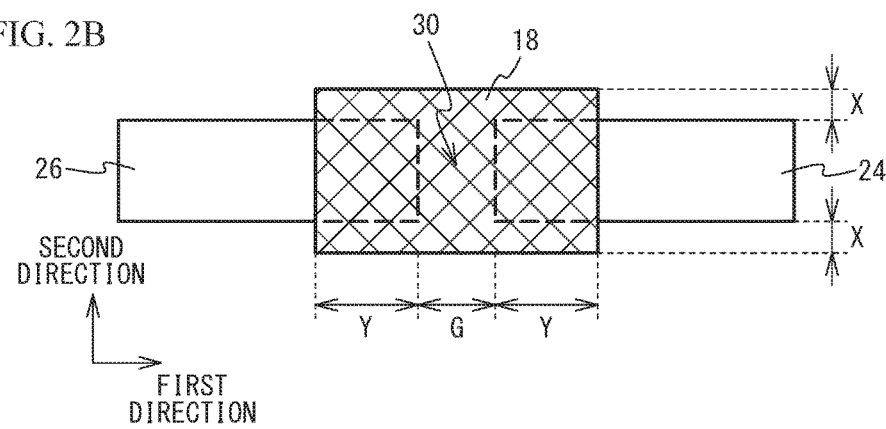
FIG. 2B is an enlarged top view of the area around the gap.

FIG. 2A is an enlarged cross-sectional view of an area around the gap 30, and FIG. 2B is an enlarged top view of the area around the gap 30. As illustrated FIG. 2A and FIG. 2B, the thickness of the additional film 18 is represented by h. The distance between the tips of the electrode finger 24 and the dummy electrode finger 26 that are located lateral to the gap 30 in the first direction is defined as a distance G of the gap 30. How much the additional film 18 covers the electrode finger 24 and the dummy electrode finger 26 that are located lateral to the gap 30 in the first direction is represented by an overlap amount Y. How much the additional film 18 protrudes in the second direction from the side surfaces of the electrode finger 24 and the dummy electrode finger 26 that are located lateral to the gap 30 in the first direction is represented by an offset amount X.

Figure 3A:
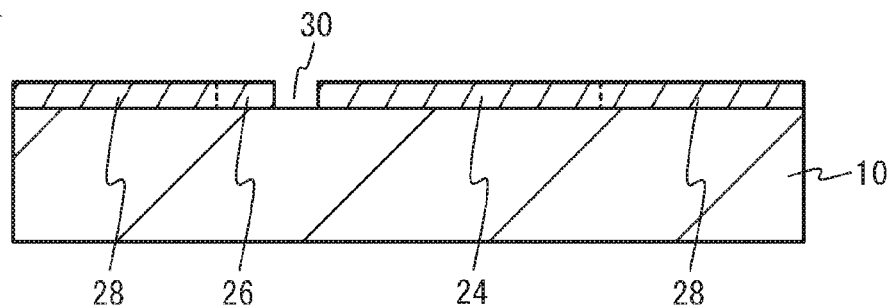
FIG. 3A through FIG. 3D are cross-sectional views illustrating a method of fabricating the surface acoustic wave device in accordance with the first embodiment.

Next, a method of fabricating the surface acoustic wave device of the first embodiment will be described. FIG. 3A through FIG. 4C are cross-sectional views illustrating the method of fabricating the surface acoustic wave device 100 in accordance with the first embodiment. As illustrated in FIG. 3A, a metal film is formed on the piezoelectric substrate 10, and then the metal film is patterned into a desired shape. This process forms the IDT 20, which is composed of the pair of comb-shaped electrodes 22 each including the electrode fingers 24, the dummy electrode fingers 26, and the bus bar 28, and the reflectors 12 on the piezoelectric substrate 10. The gaps 30 are formed between the electrode fingers 24 and the dummy electrode fingers 26. The metal film is formed by, for example, sputtering, vacuum evaporation, or Chemical Vapor Deposition (CVD). The metal film is patterned by, for example, photolithography and etching.

Figure 3B:
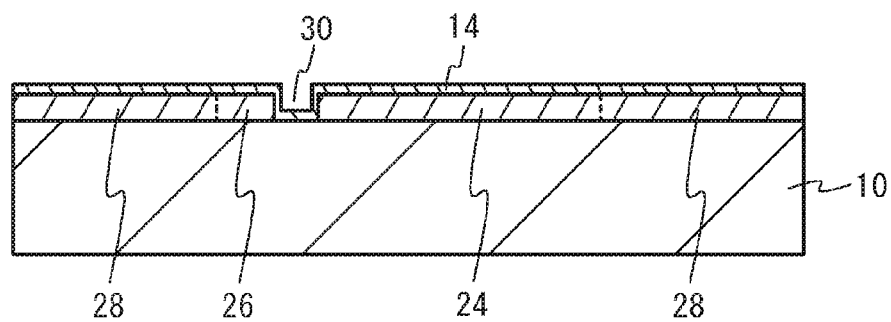

As illustrated in FIG. 3B, the protective film 14 is formed across the entire surface above the piezoelectric substrate 10. The protective film 14 is formed by, for example, sputtering, vacuum evaporation, or CVD.

Figure 3C:
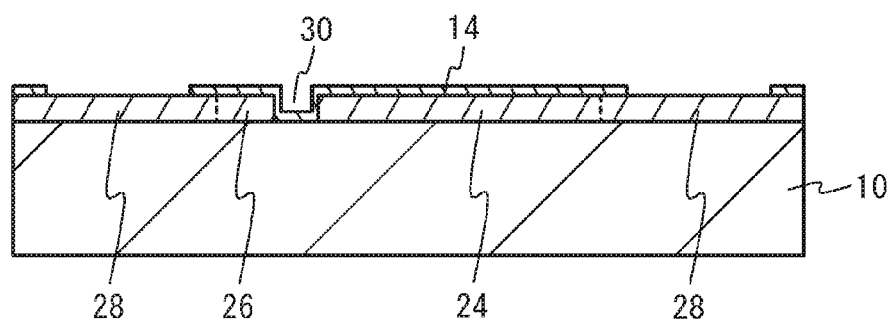

As illustrated in FIG. 3C, the protective film 14 formed on the bus bar 28 and in a region in which the metal film 16 is to be formed is removed. The protective film 14 is removed by, for example, photolithography and etching.

Figure 3D:
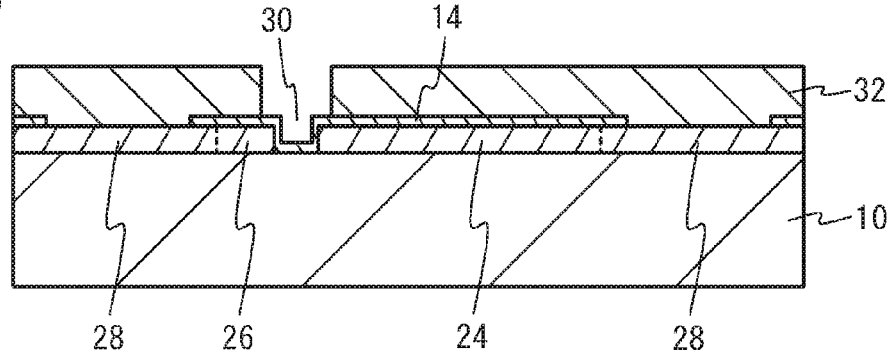

As illustrated in FIG. 3D, a resist film 32 is applied over the entire surface above the piezoelectric substrate 10, and then the resist film 32 in a region in which the additional film 18 is to be formed is removed to form an aperture.

Figure 4A:
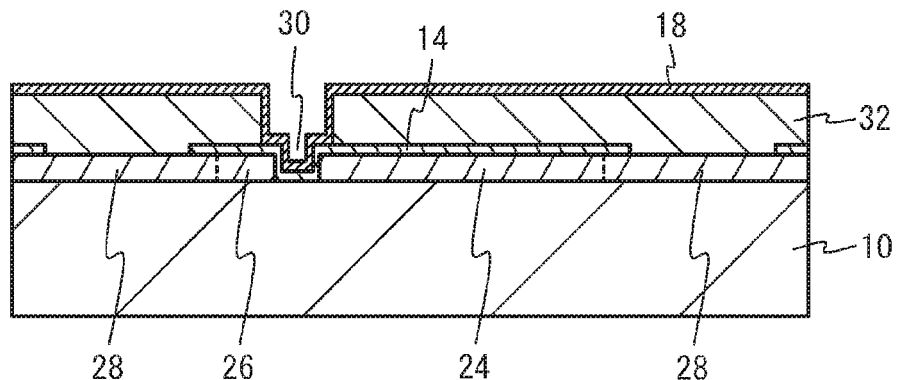
FIG. 4A through FIG. 4C are cross-sectional views illustrating the method of fabricating the surface acoustic wave device in accordance with the first embodiment.

As illustrated in FIG. 4A, the additional film 18 is formed across the entire surface above the piezoelectric substrate 10. The additional film 18 is formed in the aperture formed in the resist film 32. The additional film 18 is formed by, for example, sputtering, vacuum evaporation, or CVD.

Figure 4B:
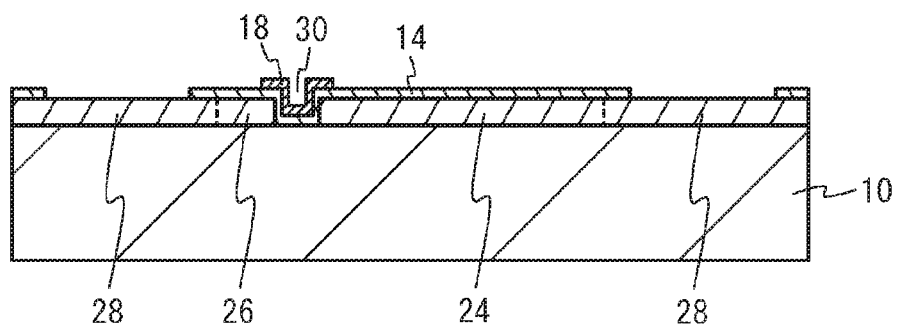

As illustrated in FIG. 4B, the resist film 32 is removed by liftoff to pattern the additional film 18. This process forms the additional films 18 in the gaps 30 between the electrode fingers 24 and the dummy electrode fingers 26. The additional films 18 are formed by a process based on the photolithographic technique. Accordingly, the additional film 18 and the gap 30 can be aligned within an average of, for example, 0.1 μm or less. Thus, the overlap amount Y of the additional film 18 with the electrode finger 24 and the dummy electrode finger 26 that are located lateral to the gap 30 in the first direction is controlled to be within an allowable value. Additionally, the offset amount X of the additional film 18 in the second direction from the side surfaces of the electrode finger 24 and the dummy electrode finger 26 that are located lateral to the gap 30 in the first direction is controlled to be within an allowable value.

Figure 4C:
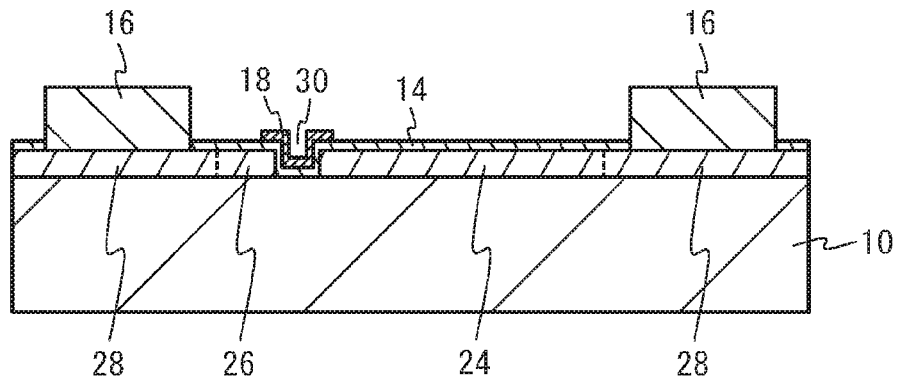

As illustrated in FIG. 4C, the metal film 16 is formed on the bus bar 28 and in the region in which the protective film 14 is removed. The metal film 16 is formed by, for example, evaporation and liftoff. The process including the above steps forms the surface acoustic wave device 100 of the first embodiment.

Next, the simulation conducted by the inventors will be described. The inventors simulated the Q characteristics of the surface acoustic wave device 100 of the first embodiment. Table 1 lists parameters of the surface acoustic wave device used for the simulation.

TABLE 1

| Piezoelectric substrate | 42° rotated Y-cut-LiTaO$_3$ |
|---|---|
| IDT and reflectors | Al 180 nm |
| Additional film | Al$_2$O$_3$ 60 nm |
| Wavelength of acoustic wave | 2 μm |
| Number of pairs of electrode fingers | 116 pairs |
| Number of electrode fingers of reflector | 40 |
| Duty ratio | 50% |
| Length of dummy electrode finger | 2.0 λ |
| Distance G of gap | 0.175 λ |
| Overlap amount Y | 0.1 λ |
| Offset amount X | 0 |

As listed in Table 1, in the simulated surface acoustic wave device, the piezoelectric substrate 10 was assumed to be a 42° rotated Y-cut X-propagation lithium tantalate (LiTaO$_3$) substrate. The IDT 20 and the reflectors 12 were assumed to be formed of an aluminum (Al) film with a thickness of 180 nm. The additional film 18 was assumed to be an aluminum oxide (Al$_2$O$_3$) film with a thickness of 60 nm. The acoustic wave excited by the IDT 20 was assumed to have a wavelength λ of 2 μm. The number of pairs of the electrode fingers 24 of the IDT 20 was assumed to be 116 pairs, and the number of electrode fingers of the reflector 12 was assumed to be 40. The duty ratio of the electrode finger 24 and the dummy electrode finger 26 was assumed to be 50%. The dummy electrode finger 26 was assumed to have a length of 2.0λ (λ is the wavelength of the acoustic wave, the same applies hereinafter). The distance G of the gap 30 was assumed to be 0.175λ. The overlap amount Y of the additional film 18 was assumed to be 0.1λ, and the offset amount X was assumed to be 0. In the simulation, the protective film 14 and the metal film 16 were assumed not to be provided.

Figure 5:
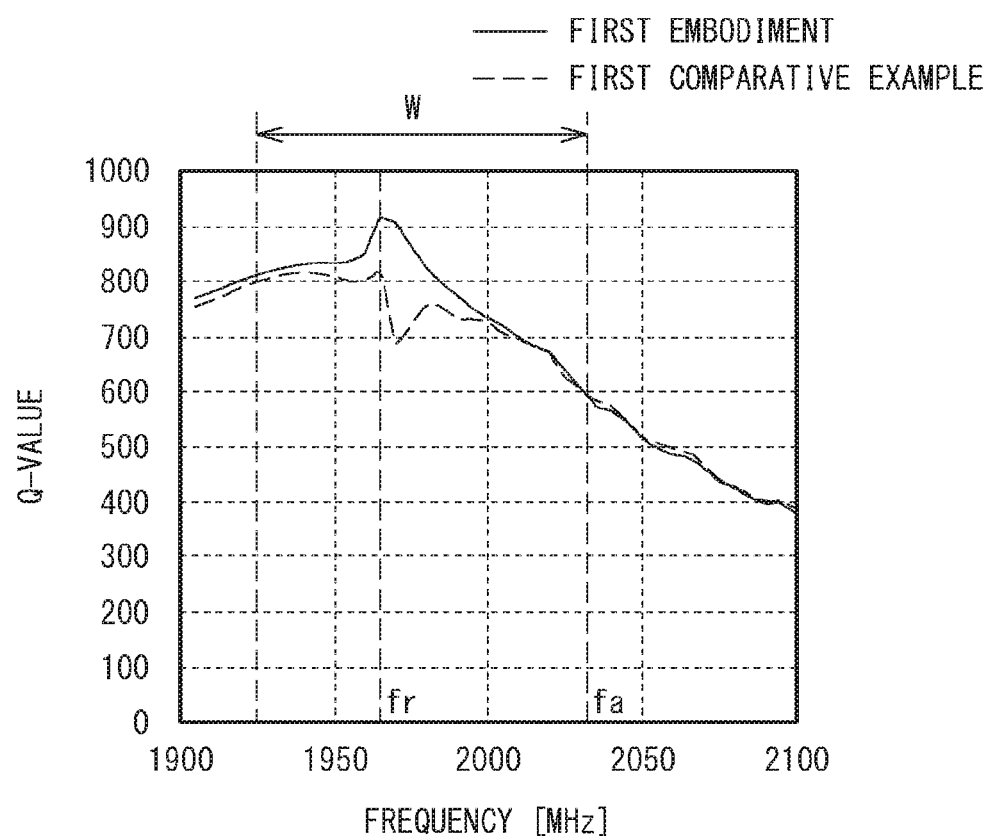
FIG. 5 illustrates simulation results of the Q characteristic of the surface acoustic wave device of the first embodiment.

FIG. 5 illustrates simulation results of the Q characteristic of the surface acoustic wave device 100 of the first embodiment. The solid line indicates the simulation results of the surface acoustic wave device 100 of the first embodiment. For comparison, the simulation was also conducted on the Q characteristic of a surface acoustic wave device of a first comparative example configured to be the same as that of the first embodiment except that the additional film 18 is not provided. The dashed line indicates the simulation result of the first comparative example. As illustrated in FIG. 5, the first embodiment improves the Q-value around the resonant frequency fr compared with the first comparative example. The simulation result reveals that the provision of the additional film 18 confines the acoustic wave, and improves the Q-value.

Next, the inventors investigated how the film thickness of the additional film 18 affects the improvement of the Q-value. Here, the inventors used the value of integral of the Q-values over the frequency interval W before and after the maximum value of the Q-value to determine whether the Q-value is improved as illustrated in FIG. 5. More specifically, the interval between frequencies in which the Q-value is hardly improved even when the additional film 18 is provided was defined as the frequency interval W. Here, the lower limit of the frequency interval W was set to 1925 MHz, and the upper limit was set to an antiresonant frequency fa (2035 MHz). The reason why the value of integral of the Q-values is used to determine the effect on the improvement as described above is because the improvement degree differs depending on the frequency in the simulation.

The simulation for investigating the relationship between the film thickness of the additional film 18 and the effect on the improvement of the Q-value was conducted by varying the distance G of the gap 30 and the film thickness of the additional film 18 and setting other parameters to the values listed in Table 1. FIG. 6A through FIG. 8 illustrate the results of the simulation for investigating the relationship between the film thickness of the additional film 18 and the Q-value. The horizontal axis represents a normalized film thickness h/λ obtained by normalizing the film thickness h of the additional film 18 by the wavelength λ of the acoustic wave. The vertical axis represents a Q normalized integral value (the Q integral value of the first embodiment/the Q integral value of the first comparative example) obtained by normalizing the integral value of the Q values of the surface acoustic wave device of the first embodiment over the frequency interval W by the integral value of the Q-values of the surface acoustic wave device of the first comparative example. Thus, the Q normalized integral value greater than one means that t the Q-value is improved in the first embodiment more than in the first comparative example. The calculated values by the simulation is indicated by black circles, and the curve that connects the calculated values including the non-illustrated calculated values at which the Q normalized integral value is less than one is also illustrated.

Figure 6A:
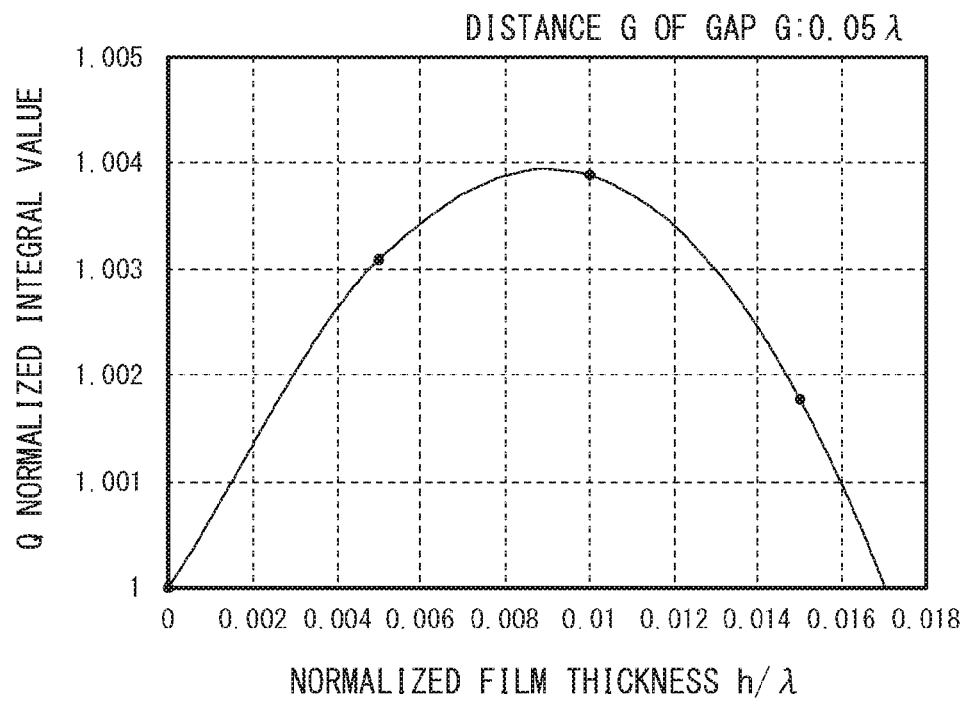
FIG. 6A and FIG. 6B are diagrams illustrating the results of a simulation for investigating the relationship between the film thickness of an additional film and a Q-value.
Figure 6B:
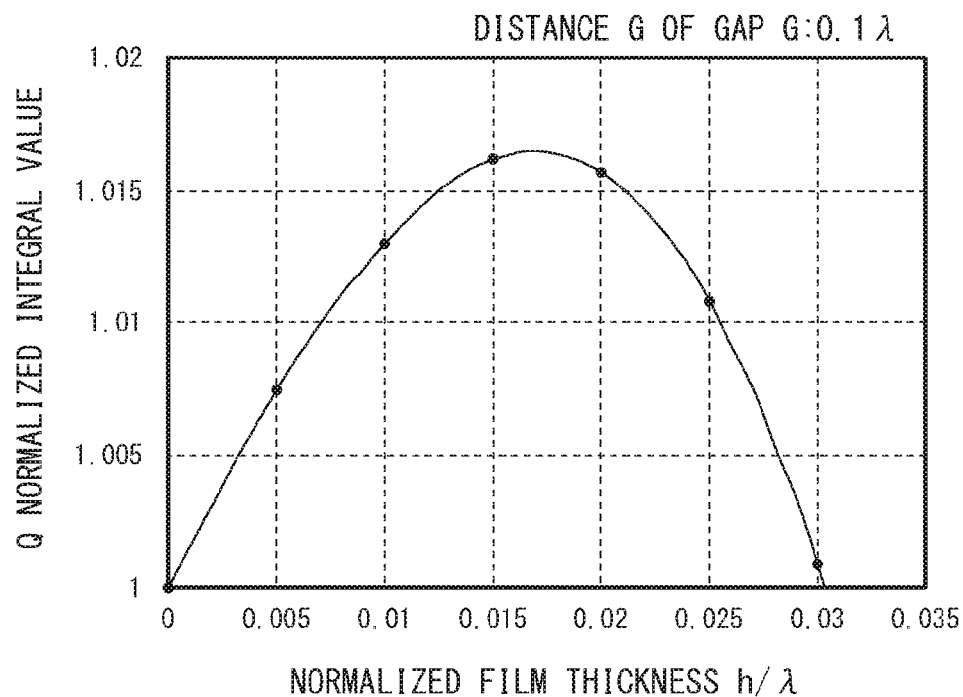

FIG. 6A illustrates the simulation results when the distance G of the gap 30 is 0.05λ. FIG. 6A reveals that the Q-value improves when the film thickness h of the additional film 18 is within a range of 0<h≤0.017λ, FIG. 6B illustrates the simulation results when the distance G of the gap 30 is 0.1λ. FIG. 6B reveals that the Q-value improves when the film thickness h of the additional film 18 is within a range of 0<h≤0.031λ.

Figure 7A:
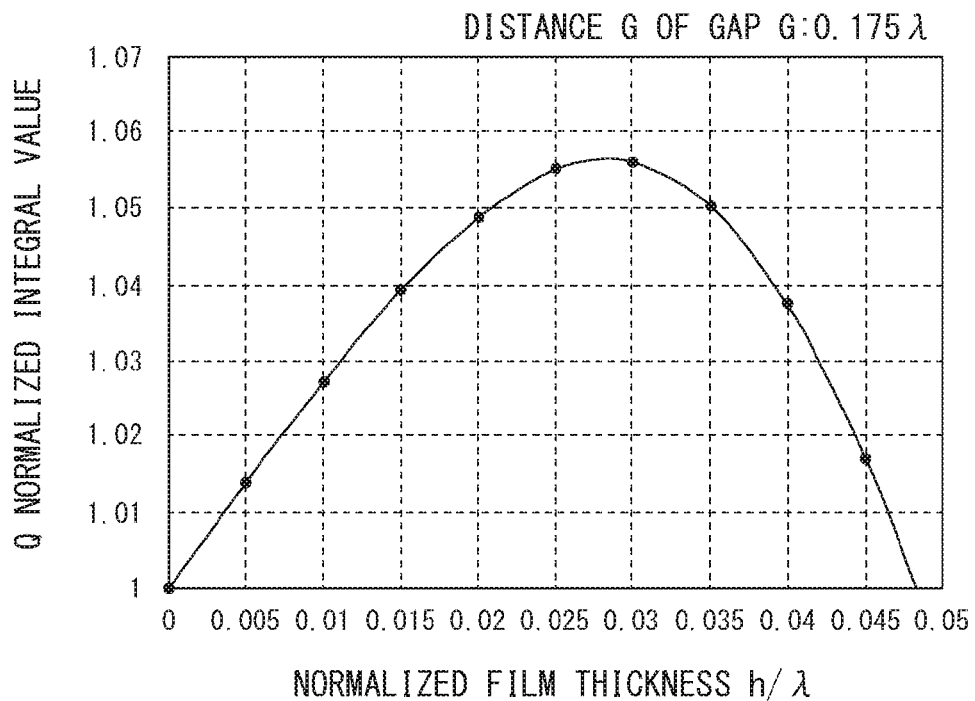
FIG. 7A and FIG. 7B are diagrams illustrating the results of the simulation for investigating the relationship between the film thickness of the additional film and the Q-value.

FIG. 7A illustrates the simulation results when the distance G of the gap 30 is 0.175λ. FIG. 7A reveals that the Q-value improves when the film thickness h of the additional film 18 is within a range of 0<h≤0.048λ.

Figure 7B:
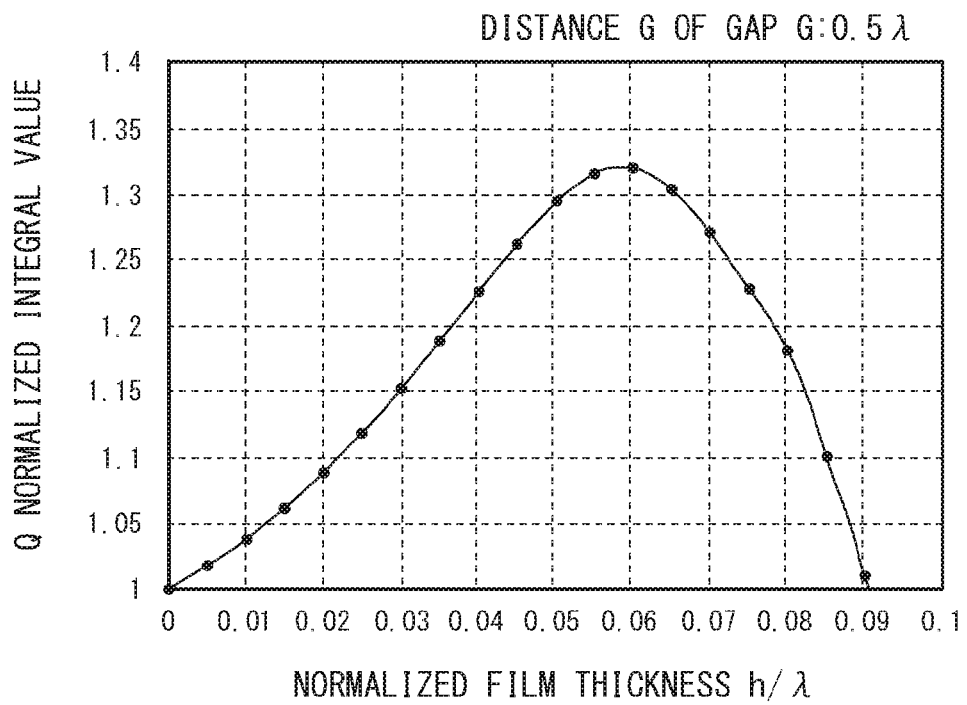

FIG. 7B illustrates the simulation result when the distance G of the gap 30 is 0.5λ. FIG. 7B reveals that the Q-value improves when the film thickness h of the additional film 18 is within a range of 0<h≤0.091λ.

Figure 8:
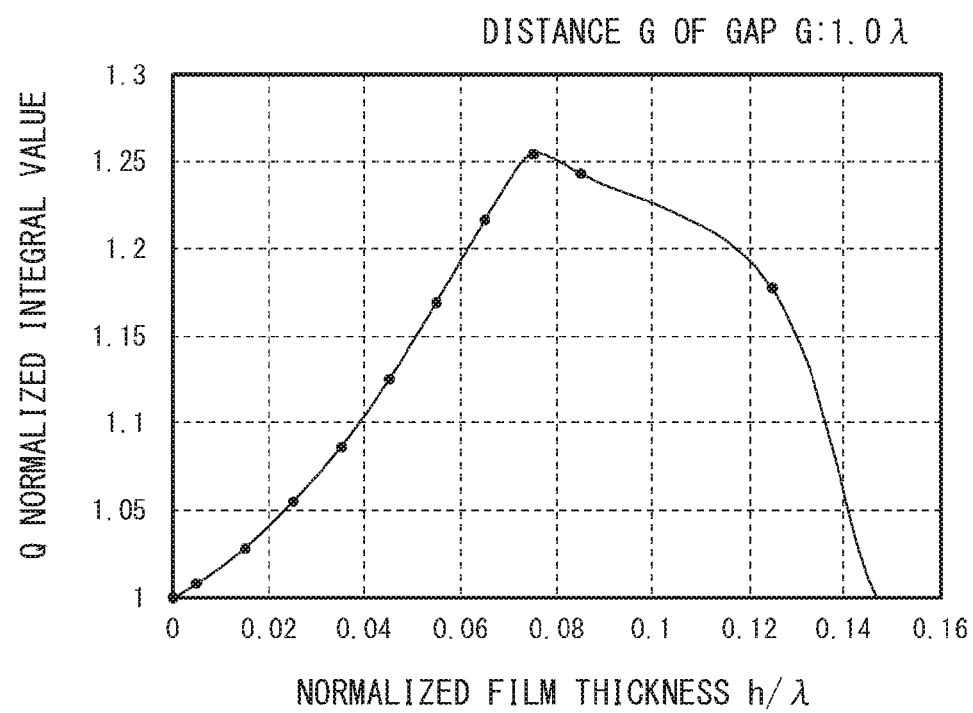
FIG. 8 is a diagram illustrating the results of the simulation for investigating the relationship between the film thickness of the additional film and the Q-value.

FIG. 8 illustrates the simulation result when the distance G of the gap 30 is 1.0λ. FIG. 8 reveals that the Q-value improves when the film thickness h of the additional film 18 is within a range of 0<h≤0.146λ.

Figure 9:
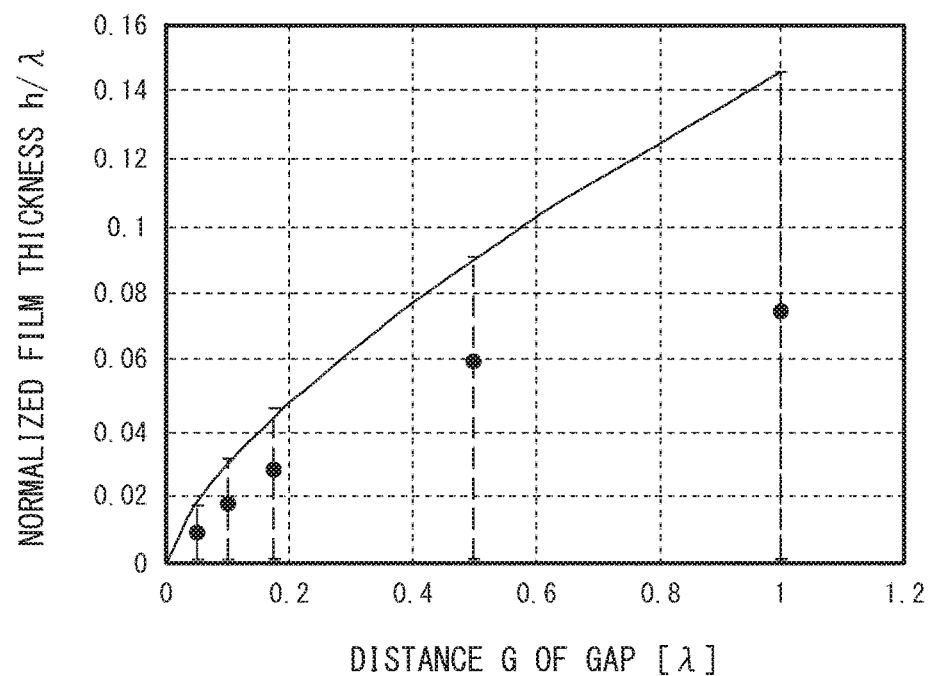
FIG. 9 is a diagram indicating the range of the film thickness of the additional film within which the Q-value improves obtained from the simulation results of FIG. 6A through FIG. 8.

FIG. 9 is a diagram indicating the range of the film thickness of the additional film 18 within which the Q-value improves obtained from the simulation results illustrated in FIG. 6A through FIG. 8. The horizontal axis represents the distance G (λ) of the gap 30. The vertical axis represents the normalized film thickness h/λ of the additional film 18. The dashed line indicates the range of the normalized film thickness of the additional film 18 within which the Q-value improves obtained from FIG. 6A through FIG. 8, and black circles indicate the film thickness with which the Q normalized integral value takes a maximum value. The solid line indicates the approximate curve that passes the inside of the maximum value of the normalized film thickness of the additional film 18 with which the Q-value improves. As illustrated in FIG. 9, as the distance G of the gap 30 increases, the range of the film thickness of the additional film 18 within which the Q-value improves increases. When the distance G of the gap 30 is within a range of 0<G≤1.0λ, the Q-value improves as long as the film thickness h of the additional film 18 satisfies 0<h/λ≤0.146G+0.694076.

FIG. 9 illustrates the simulation results when the additional film 18 is formed of an aluminum oxide film. When the material of the additional film 18 is changed, the density changes. Thus, the range of the film thickness within which the Q-value improves changes. Therefore, when the additional film 18 is formed of a material other than aluminum oxide, the range of the film thickness according to the density of the material may be configured. That is to say, when the density of the material of the additional film 18 is represented by ρ1, and the density of aluminum oxide is represented by ρ2, the Q-value improves when the film thickness h of the additional film 18 satisfies 0<h/λ≤ (0.146G+0.694076)×ρ2/ρ1.

As described above, when the film thickness h of each additional film 18 located in the corresponding gap 30 satisfies 0<h/λ≤(0.146G+0.694076)×ρ2/ρ1 under the condition that the distance G of the gap 30 is within a range of 0<G≤1.0λ, the Q-value improves, and the loss is reduced.

Figure 10A:
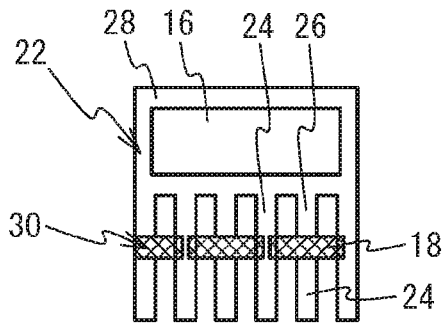
FIG. 10A through FIG. 10F are top views of other examples of the additional film.
Figure 10D:
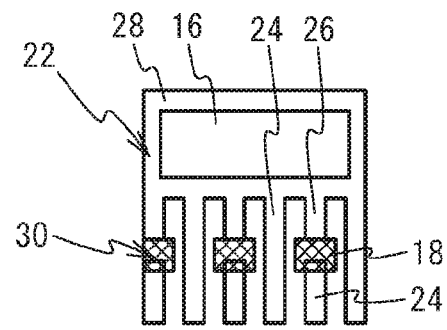
Figure 10B:
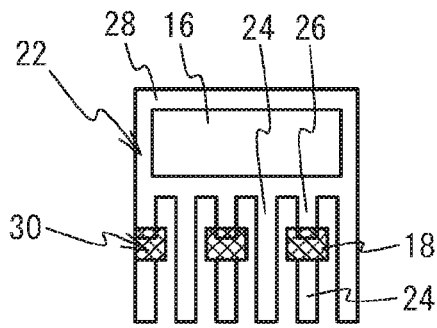
Figure 10E:
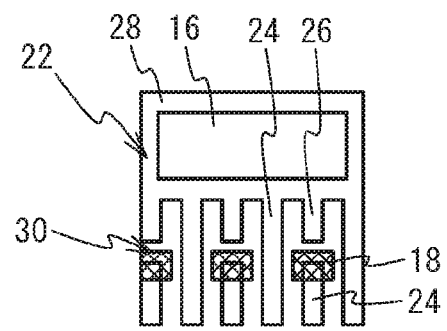
Figure 10C:
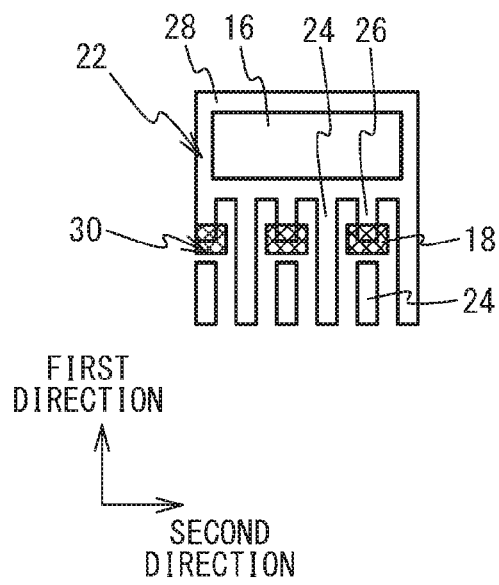
Figure 10F:
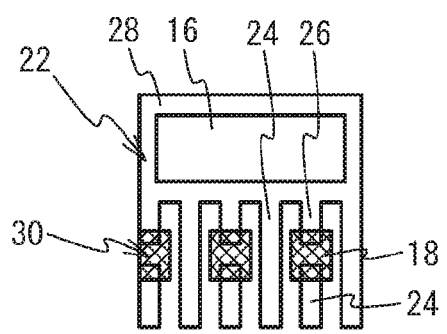

The first embodiment has described an exemplary case where each of the additional films 18 overlaps with the electrode finger 24 and the dummy electrode finger 26 that are located lateral to the corresponding gap 30 in the first direction, and does not overlap with the electrode finger 24 located lateral to the corresponding gap 30 in the second direction as illustrated in FIG. 1. However, this does not intend to suggest any limitation. FIG. 10A through FIG. 10F are top views illustrating other examples of the additional film 18. As illustrated in FIG. 10A, the additional film 18 may overlap with the electrode fingers 24 located lateral to the corresponding gap 30 in the second direction. In this case, the additional film 18 overlaps with the electrode fingers 24 at the corresponding gap 30 side from the center of the width of the electrode finger 24. As illustrated in FIG. 10B, the additional film 18 may contact the boundary between the electrode finger 24 located lateral to the corresponding gap 30 in the first direction and the corresponding gap 30 and overlap with the dummy electrode finger 26. As illustrated in FIG. 10C, the additional film 18 may distant from the electrode finger 24 located lateral to the corresponding gap 30 in the first direction and overlap with the dummy electrode finger 26. As illustrated in FIG. 10D, the additional film 18 may contact the boundary between the dummy electrode finger 26 located lateral to the corresponding gap 30 in the first direction and the corresponding gap 30 and overlap with the electrode finger 24. As illustrated in FIG. 10E, the additional film 18 may distant from the dummy electrode finger 26 located lateral to the corresponding gap 30 in the first direction and overlap with the electrode finger 24. As illustrated in FIG. 10F, the additional film 18 may overlap with the electrode finger 24 and the dummy electrode finger 26 that are located lateral to the corresponding gap 30 in the first direction and protrude from the side surfaces of the electrode finger 24 and the dummy electrode finger 26 in the second direction. As described above, each of the additional films 18 is required to overlap with at least a part of at least one of the electrode fingers 24 and the dummy electrode fingers 26 that are located lateral to the corresponding gap 30 in the first direction or in the second direction. This configuration eases the accuracy in the alignment when the additional film 18 is formed, and allows to easily form the additional film 18.

In the first embodiment, the piezoelectric substrate 10 is not limited to a lithium tantalate substrate, and may be another piezoelectric substrate such as a lithium niobate substrate. The IDT 20 and the reflectors 12 are not limited to an aluminum film, and may be a metal film such as a copper film or an aluminum film to which copper is added. The additional film 18 may be a dielectric film such as a tantalum oxide film or a silicon oxide film, or may be a metal film instead of an aluminum oxide film.

Second Embodiment

Figure 11:
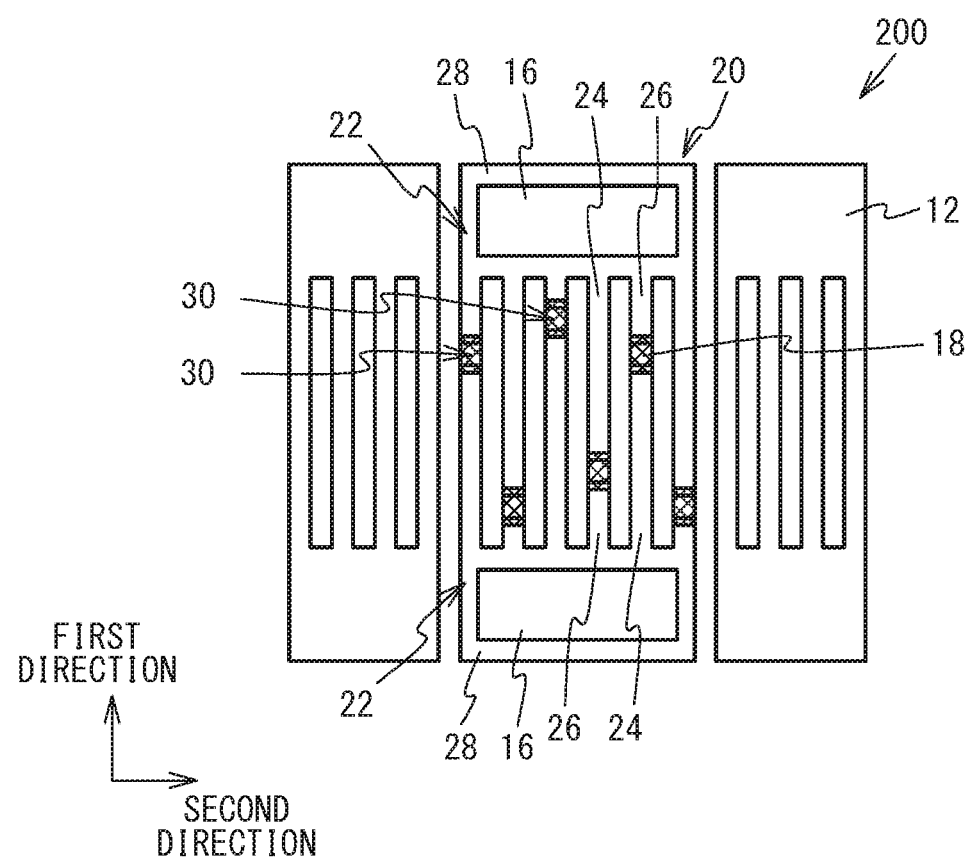
FIG. 11 is a top view of a surface acoustic wave device in accordance with a second embodiment.

FIG. 11 is a top view of a surface acoustic wave device 200 in accordance with a second embodiment. In FIG. 11, the illustration of the protective film 14 is omitted as in the first embodiment. As illustrated in FIG. 11, the surface acoustic wave device 200 of the second embodiment includes a pair of the comb-shaped electrodes 22 in each of which the electrode fingers 24 with different lengths are repeatedly arranged and the dummy electrode fingers 26 with different lengths are repeatedly arranged. This configuration forms the gaps 30 in different positions in the first direction. Other configurations are the same as those of the first embodiment, and thus the description is omitted.

As in the second embodiment, the gaps 30 may be formed in different positions in the first direction. Even in this case, when the distance G of the gap 30 is in a range of 0<G≤1.0λ and the film thickness h of the additional films 18 satisfies 0<h/λ≤(0.146G+0.694076)×ρ2/ρ1, the Q-value improves.

Also in the second embodiment, the additional films 18 may have any one of the shapes described in FIG. 10A through FIG. 10F.

Third Embodiment

Figure 12A:
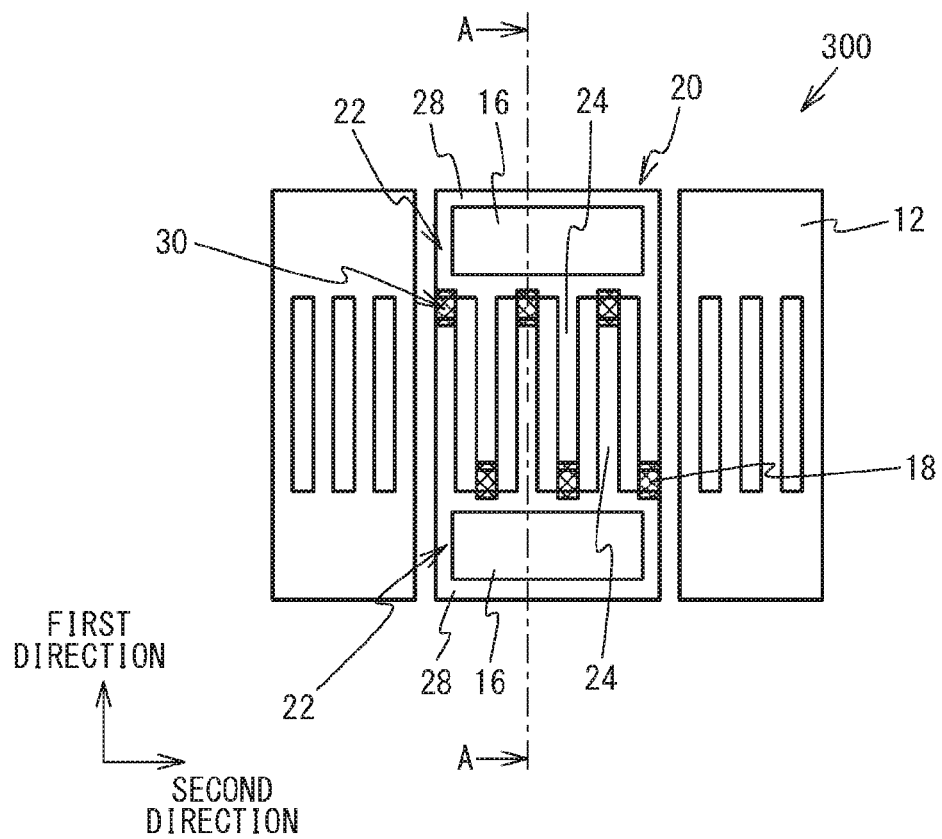
FIG. 12A is a top view of a surface acoustic wave device in accordance with a third embodiment.
Figure 12B:
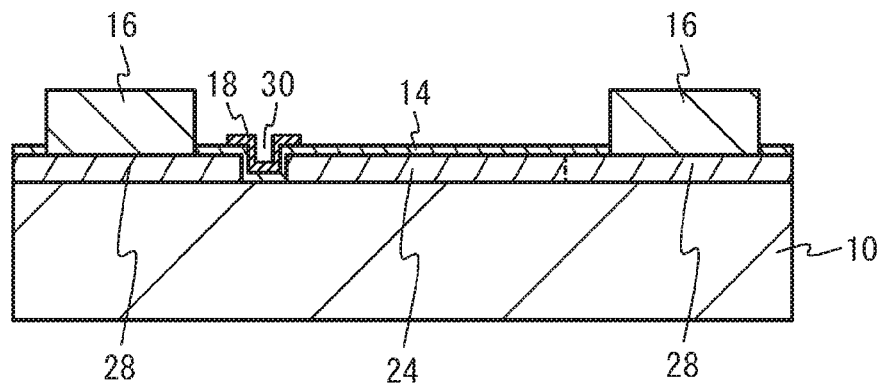
FIG. 12B is a cross-sectional view taken along line A-A in FIG. 12A.

FIG. 12A is a top view of a surface acoustic wave device 300 in accordance with a third embodiment, and FIG. 12B is a cross-sectional view taken along line A-A in FIG. 12A. FIG. 12A omits the illustration of the protective film 14 as in the first embodiment. As illustrated in FIG. 12A and FIG. 12B, the surface acoustic wave device 300 of the third embodiment does not include the dummy electrode fingers 26 between the electrode fingers 24. The pair of the comb-shaped electrodes 22 is configured so that the electrode fingers 24 of a first comb-shaped electrode of the pair of the comb-shaped electrodes 22 and the bus bar 28 of a second comb-shaped electrode of the pair of the comb-shaped electrodes 22 are arranged to face each other. This configuration forms the gaps 30 between the tips of the electrode fingers 24 and the end of the bus bar 28 facing the tips of the electrode fingers 24. The additional films 18 are located in the gaps 30. Each of the additional films 18 overlaps with the electrode finger 24 and the bus bar 28 located lateral to the corresponding gap 30 in the first direction and does not overlap with the electrode finger 24 located lateral to the corresponding gap 30 in the second direction. Other configurations are the same as those of the first embodiment, and thus the description thereof is omitted.

As in the third embodiment, each of the additional films 18 may cover the corresponding gap 30 and overlap with at least a part of at least one of the electrode fingers 24 and the bus bars 28 located lateral to the corresponding gap 30 in the first direction or in the second direction. Even in this case, when the distance G of the gap 30 is in a range of $0<G\leq1.0\lambda$ and the film thickness h of the additional films 18 satisfies $0<h/\lambda\leq(0.146G+0.694076)\times\rho2/\rho1$, the Q-value improves.

Also in the third embodiment, the additional films 18 may have any one of the shapes described in FIG. 10A through FIG. 10F.

Figure 13:
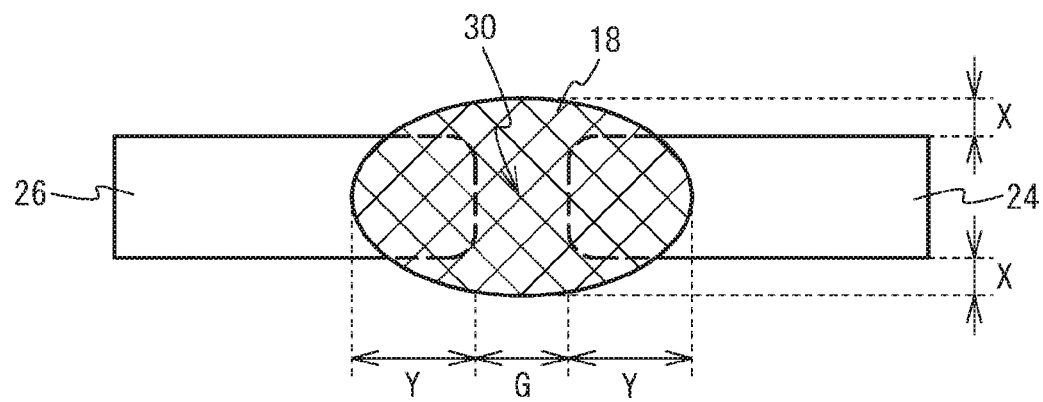
FIG. 13 is a top view illustrating another example of the additional film.

In the first embodiment through the third embodiment, the additional film 18 has a rectangular shape, but this does not intend to suggest any limitation. The additional film 18 may have other shapes such as a circle. FIG. 13 is a top view of another example of the additional film 18. As illustrated in FIG. 13, the additional film 18 may have an elliptical shape.

In the first embodiment through the third embodiment, the additional films 18 are preferably provided in all the gaps 30 to prevent the leakage of the acoustic wave energy, but may not be provided in some of the gaps 30.

Fourth Embodiment

Figure 14:
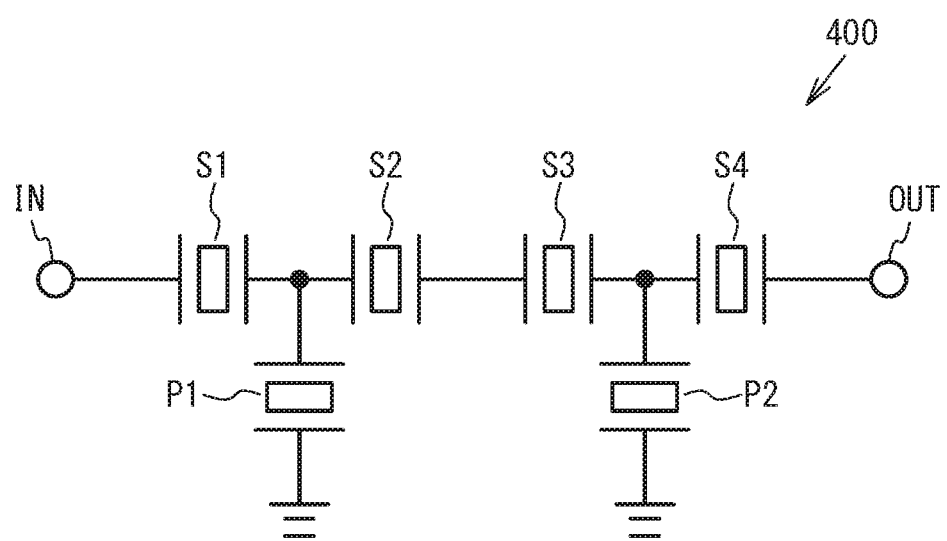
FIG. 14 illustrates a ladder-type filter in accordance with a fourth embodiment.

FIG. 14 is a ladder-type filter 400 in accordance with a fourth embodiment. As illustrated in FIG. 14, the ladder-type filter 400 of the fourth embodiment includes one or more series resonators S1 through S4 connected in series between an input terminal In and an output terminal Out and one or more parallel resonators P1 and P2 connected in parallel between the input terminal In and the output terminal Out. At least one of the series resonators S1 through S4 and the parallel resonators P1 and P2 may be the surface acoustic wave device according to any one of the first embodiment through the third embodiment.

The use of the surface acoustic wave devices of the first embodiment through the third embodiment for the ladder-type filter improves the insertion loss. Even when the additional film 18 is located, the electromechanical coupling coefficient of the resonator is less decreased. Therefore, the pass characteristics and the suppression characteristics outside the passband are maintained at almost the same characteristics. Thus, the effect on the improvement of the insertion loss is obtained only by providing the additional film 18 to a configuration of which the design without the additional film 18 is already completed without changing the design.

The fourth embodiment has described a ladder-type filter as an example, but the filter may be other acoustic wave filters such as a multimode type filter.

Fifth Embodiment

Figure 15:
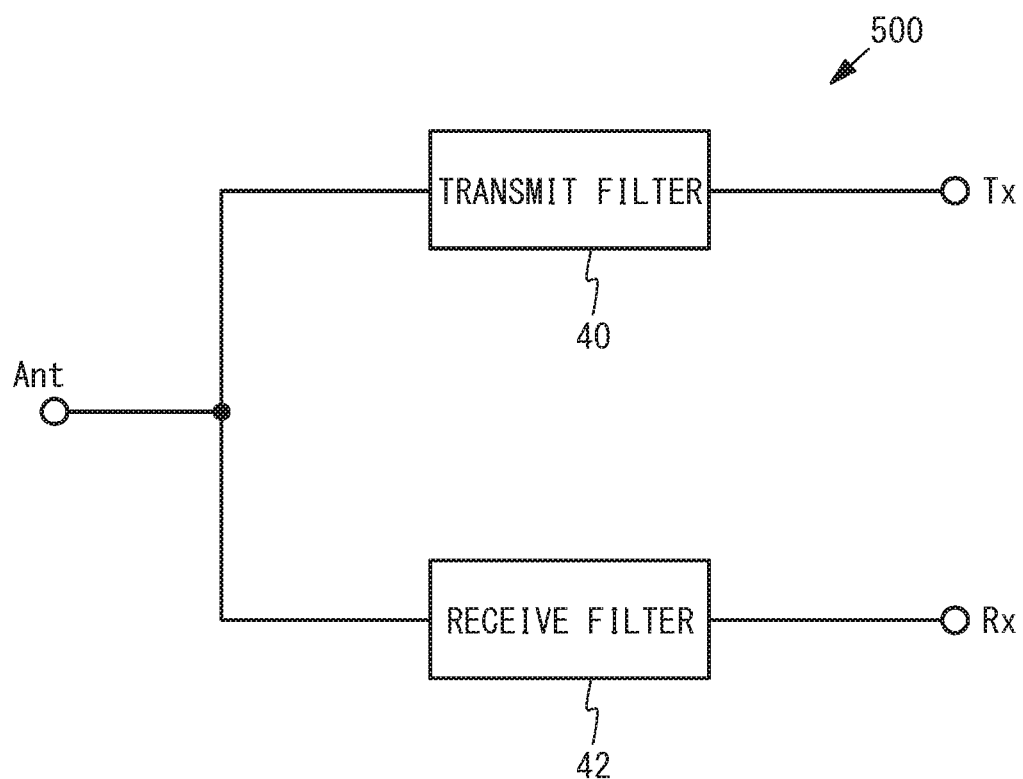
FIG. 15 is a block diagram of a duplexer in accordance with a fifth embodiment.

FIG. 15 is a block diagram of a duplexer 500 in accordance with a fifth embodiment. As illustrated in FIG. 15, the duplexer 500 of the fifth embodiment includes a transmit filter 40 and a receive filter 42. The transmit filter 40 is connected between an antenna terminal Ant and a transmit terminal Tx. The receive filter 42 is connected between the antenna terminal Ant shared with the transmit filter 40 and a receive terminal Rx.

The transmit filter 40 passes signals within the transmit band, among signals input from the transmit terminal Tx, to the antenna terminal Ant as a transmission signal, and suppresses signals with other frequencies. The receive filter 42 passes signals within the receive band, among signals input from the antenna terminal Ant, to the receive terminal Rx as a reception signal, and signals with other frequencies. The frequency of the transmit band differs from the frequency of the receive band. A matching circuit that matches impedance may be provided so that the transmission signal passing through the transmit filter 40 is output from the antenna terminal Ant without leaking to the receive filter 42.

At least one of the transmit filter 40 and the receive filter 42 included in the duplexer 500 of the fifth embodiment may be the acoustic wave filter described in the fourth embodiment.

Although the embodiments of the present invention have been described in detail, it is to be understood that the various change, substitutions, and alterations could be made hereto without departing from the spirit and scope of the invention.

What is claimed is:

1. A surface acoustic wave device comprising:
a pair of comb-shaped electrodes located on a piezoelectric substrate, each of the pair of comb-shaped electrodes including a plurality of electrode fingers and a plurality of dummy electrode fingers, the plurality of electrode fingers of a first comb-shaped electrode of the pair of comb-shaped electrodes and the plurality of dummy electrode fingers of a second comb-shaped electrode of the pair of comb-shaped electrodes being arranged to face each other; and
a plurality of additional films, each being located so as to cover a corresponding gap of a plurality of gaps between tips of the plurality of electrode fingers of the first comb-shaped electrode and tips of the plurality of dummy electrode fingers of the second comb-shaped electrode, each of the plurality of additional films covering a single gap among the plurality of gaps,
wherein each of the plurality of additional films overlaps with at least a part of at least one of the electrode fingers and the dummy electrode fingers that are located lateral to the corresponding gap in a first direction in which the plurality of electrode fingers extend or in a second direction intersecting with the first direction among the plurality of electrode fingers and the plurality of dummy electrode fingers, and
a distance G between the tips of the plurality of electrode fingers of the first comb-shaped electrode and the tips of the plurality of dummy electrode fingers of the second comb-shaped electrode is $0<G\leq1.0\lambda$ and a film thickness h of the plurality of additional films is $0<h/\lambda\leq(0.146G+0.694076)\times\rho2/\rho1$ where $\lambda$ is a wavelength of an acoustic wave excited in the pair of comb-shaped electrodes, $\rho1$ is a density of a material of the plurality of additional films, and $\rho2$ is a density of aluminum oxide.

2. The surface acoustic wave device according to claim 1, wherein
each of the plurality of additional films overlaps with at least one of the electrode finger and the dummy electrode finger located lateral to the corresponding gap in the first direction, and does not overlap with the electrode finger located lateral to the corresponding gap in the second direction.

3. The surface acoustic wave device according to claim 1, wherein
the pair of comb-shaped electrodes are formed of an aluminum film.

4. The surface acoustic wave device according to claim 1, wherein
the piezoelectric substrate is a lithium tantalate substrate.

5. The surface acoustic wave device according to claim 1, wherein
the plurality of additional films are formed of an aluminum oxide film, a tantalum film, or a silicon oxide film.

6. The surface acoustic wave device according to claim 1, further comprising:
a protective film covering the pair of comb-shaped electrodes,
wherein the plurality of additional films is located on the protective film.

7. A surface acoustic wave device comprising:
a pair of comb-shaped electrodes located on a piezoelectric substrate, each of the pair of comb-shaped electrodes including a plurality of electrode fingers and a bus bar to which the plurality of electrode fingers are connected, the plurality of electrode fingers of a first comb-shaped electrode of the pair of comb-shaped electrodes and the bus bar of a second comb-shaped electrode of the pair of comb-shaped electrodes being arranged to face each other; and
a plurality of additional films, each being located to cover a corresponding gap of a plurality of gaps between tips of the plurality of electrode fingers of the first comb-shaped electrode and the bus bar of the second comb-shaped electrode,
wherein each of the plurality of additional films overlaps with at least a part of at least one of the electrode fingers and the bus bar that are located lateral to the corresponding gap in a first direction in which the plurality of electrode fingers extend or in a second direction intersecting with the first direction among the plurality of electrode fingers and the bus bars, and
a distance G between the tips of the plurality of electrode fingers of the first comb-shaped electrode and the bus bar of the second comb-shaped electrode is $0<G\leq1.0\lambda$ and a film thickness h of the plurality of additional films is $0<h/\lambda\leq(0.146G+0.694076)\times\rho2/\rho1$ where $\lambda$ is a wavelength of an acoustic wave excited in the pair of comb-shaped electrodes, $\rho1$ is a density of a material of the plurality of additional films, and $\rho2$ is a density of aluminum oxide.

8. The surface acoustic wave device according to claim 7, wherein
the pair of comb-shaped electrodes are formed of an aluminum film.

9. The surface acoustic wave device according to claim 7, wherein
each of the plurality of additional films overlaps with at least one of the electrode finger and the bus bar that are located lateral to the corresponding gap in the first direction, and does not overlap with the electrode finger located lateral to the corresponding gap in the second direction.

10. The surface acoustic wave device according to claim 7, wherein
the piezoelectric substrate is a lithium tantalate substrate.

11. The surface acoustic wave device according to claim 7, wherein
the plurality of additional films are formed of an aluminum oxide film, a tantalum film, or a silicon oxide film.

12. The surface acoustic wave device according to claim 7, further comprising:
a protective film covering the pair of comb-shaped electrodes,
wherein the plurality of additional films is located on the protective film.

13. A filter comprising:
a surface acoustic wave device comprising:
a pair of comb-shaped electrodes located on a piezoelectric substrate, each of the pair of comb-shaped electrodes including a plurality of electrode fingers and a plurality of dummy electrode fingers, the plurality of electrode fingers of a first comb-shaped electrode of the pair of comb-shaped electrodes and the plurality of dummy electrode fingers of a second comb-shaped electrode of the pair of comb-shaped electrodes being arranged to face each other; and
a plurality of additional films, each being located so as to cover a corresponding gap of a plurality of gaps between tips of the plurality of electrode fingers of the first comb-shaped electrode and tips of the plurality of dummy electrode fingers of the second comb-shaped electrode, each of the plurality of additional films covering a single gap among the plurality of gaps,
wherein each of the plurality of additional films overlaps with at least a part of at least one of the electrode fingers and the dummy electrode fingers that are located lateral to the corresponding gap in a first direction in which the plurality of electrode fingers extend or in a second direction intersecting with the first direction among the plurality of electrode fingers and the plurality of dummy electrode fingers, and
a distance G between the tips of the plurality of electrode fingers of the first comb-shaped electrode and the tips of the plurality of dummy electrode fingers of the second comb-shaped electrode is $0<G\leq1.0\lambda$ and a film thickness h of the plurality of additional films is $0<h/\lambda\leq(0.146G+0.694076)\times\rho2/\rho1$ where $\lambda$ is a wavelength of an acoustic wave excited in the pair of comb-shaped electrodes, $\rho1$ is a density of a material of the plurality of additional films, and $\rho2$ is a density of aluminum oxide.

* * * * *